US010554866B2

(12) United States Patent
Sun et al.

(10) Patent No.: US 10,554,866 B2
(45) Date of Patent: Feb. 4, 2020

(54) METHODS FOR LOCATING A NOISE SOURCE IN A CATV SYSTEM (71) Applicant: VIAVI SOLUTIONS, INC., San Jose, CA (US)

(72) Inventors: Dexin Sun, Indianapolis, IN (US); Adam Woolsey, Indianapolis, IN (US)

(73) Assignee: VIAVI SOLUTIONS, INC., San Jose, CA (US)

( * ) Notice: Subject to any disclaimer, the term of this patent is extended or adjusted under 35 U.S.C. 154(b) by 0 days.

(21) Appl. No.: 16/373,573

(22) Filed: Apr. 2, 2019

(65) Prior Publication Data
US 2019/0268506 A1 Aug. 29, 2019

Related U.S. Application Data (63) Continuation of application No. 15/815,407, filed on Nov. 16, 2017, now Pat. No. 10,250,781.

(51) Int. Cl.
*H04N 5/21* (2006.01)
*G01R 23/165* (2006.01)
*H04B 3/46* (2015.01)
*H04H 20/12* (2008.01)
*H04H 20/78* (2008.01)

(52) U.S. Cl.
CPC ............ *H04N 5/21* (2013.01); *G01R 23/165* (2013.01); *H04B 3/46* (2013.01); *H04H 20/12* (2013.01); *H04H 20/78* (2013.01)

(58) Field of Classification Search
CPC ................................. H04H 20/78; H04N 17/00
See application file for complete search history.

(56) References Cited

U.S. PATENT DOCUMENTS

| | | | | | |
|---|---|---|---|---|---|
| 5,473,361 | A | * | 12/1995 | Penney | H04N 7/102 348/E17.001 |
| 5,608,428 | A | * | 3/1997 | Bush | H04H 20/12 348/180 |
| 5,881,362 | A | * | 3/1999 | Eldering | H04N 7/102 348/E7.052 |
| 6,160,990 | A | * | 12/2000 | Kobayashi | H04N 7/102 348/E7.052 |
| 6,292,944 | B1 | * | 9/2001 | Harris | H04H 20/12 324/512 |
| 6,307,593 | B1 | * | 10/2001 | Bowyer | H04N 7/087 348/192 |
| 8,724,681 | B2 | * | 5/2014 | Maxson | H04B 5/0043 375/222 |
| 8,752,108 | B2 | * | 6/2014 | Bouchard | G08G 1/127 324/528 |
| 9,357,163 | B2 | * | 5/2016 | Maxson | H04H 20/12 |
| 9,450,686 | B2 | * | 9/2016 | Gotwals | H04L 43/50 |
| 10,250,781 | B1 | * | 4/2019 | Sun | H04H 20/12 |

(Continued)

*Primary Examiner* — Paulos M Natnael
(74) *Attorney, Agent, or Firm* — DLA Piper LLP (US)

(57) ABSTRACT

Methods for locating noise in a CATV system are disclosed. The methods may use a probe or instrument configured to be coupled to a port of the CATV system. The probe may be operable to selectively filter signals in the CATV system to suppress the frequencies at which noise may be present in the CATV system. In some embodiments, the methods may also use a signal level meter, and the probe may be configured to be coupled to the signal level meter to detect and locate noise in the CATV system.

20 Claims, 6 Drawing Sheets

(56) References Cited

U.S. PATENT DOCUMENTS

| | | | |
|---|---|---|---|
| 10,284,294 B2* | 5/2019 | Bush | H04B 10/25751 |
| 2017/0077988 A1* | 3/2017 | Flask | H04B 3/46 |
| 2018/0192045 A1* | 7/2018 | Bush | H04L 12/413 |
| 2019/0174162 A1* | 6/2019 | Soltanpur | H04B 1/1027 |
| 2019/0268506 A1* | 8/2019 | Sun | H04N 5/21 |

* cited by examiner

METHODS FOR LOCATING A NOISE SOURCE IN A CATV SYSTEM

CROSS-REFERENCE TO RELATED APPLICATION

This application is a continuation of U.S. patent application Ser. No. 15/815,407, filed Nov. 16, 2017, the entire disclosure of which is incorporated by reference herein.

TECHNICAL FIELD

The present disclosure relates generally to cable television (CATV) system installation and maintenance at a subscriber's premises, and, more particularly, to locating a point of ingress of noise into the CATV system.

BACKGROUND

The installation of equipment at a subscriber's premises and the maintenance of the physical plant in a CATV system are among the tasks typically assigned to technicians. Technicians typically use leakage meters, signal level meters, and other equipment to complete these tasks. For example, technicians have typically used signal level meters to measure the physical properties of signals intended to be present on the CATV system and also to measure signals that are intruding (ingress) into the system. This is usually done by physically connecting the signal level meter to a test point in the CATV system.

A technician may also utilize a test probe that may be attached to a port of a distribution tap located at a subscriber's premises, and the technician may connect a signal level meter or analyzer to the probe to measure forward and reverse signals in the system, as well as ingress. One example of a test probe is shown and described in U.S. Pat. No. 6,292,944, which is expressly incorporated herein by reference. One commercially available test probe is the I-Stop™ Reverse Test Probe, which is a commercially available from Trilithic, Inc.

SUMMARY

According to one aspect of the disclosure, methods for locating noise in a CATV system are disclosed. The methods may use a probe or instrument configured to be coupled to a port of the CATV system. The probe may be operable to selectively filter signals in the CATV system to suppress the frequencies at which noise may be present in the CATV system. In some embodiments, the methods may also use a signal level meter, and the probe may be configured to be coupled to the signal level meter to detect and locate noise in the CATV system.

BRIEF DESCRIPTION OF THE DRAWINGS

The detailed description particularly refers to the following figures, in which.

DETAILED DESCRIPTION OF THE DRAWINGS

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Figure 1:
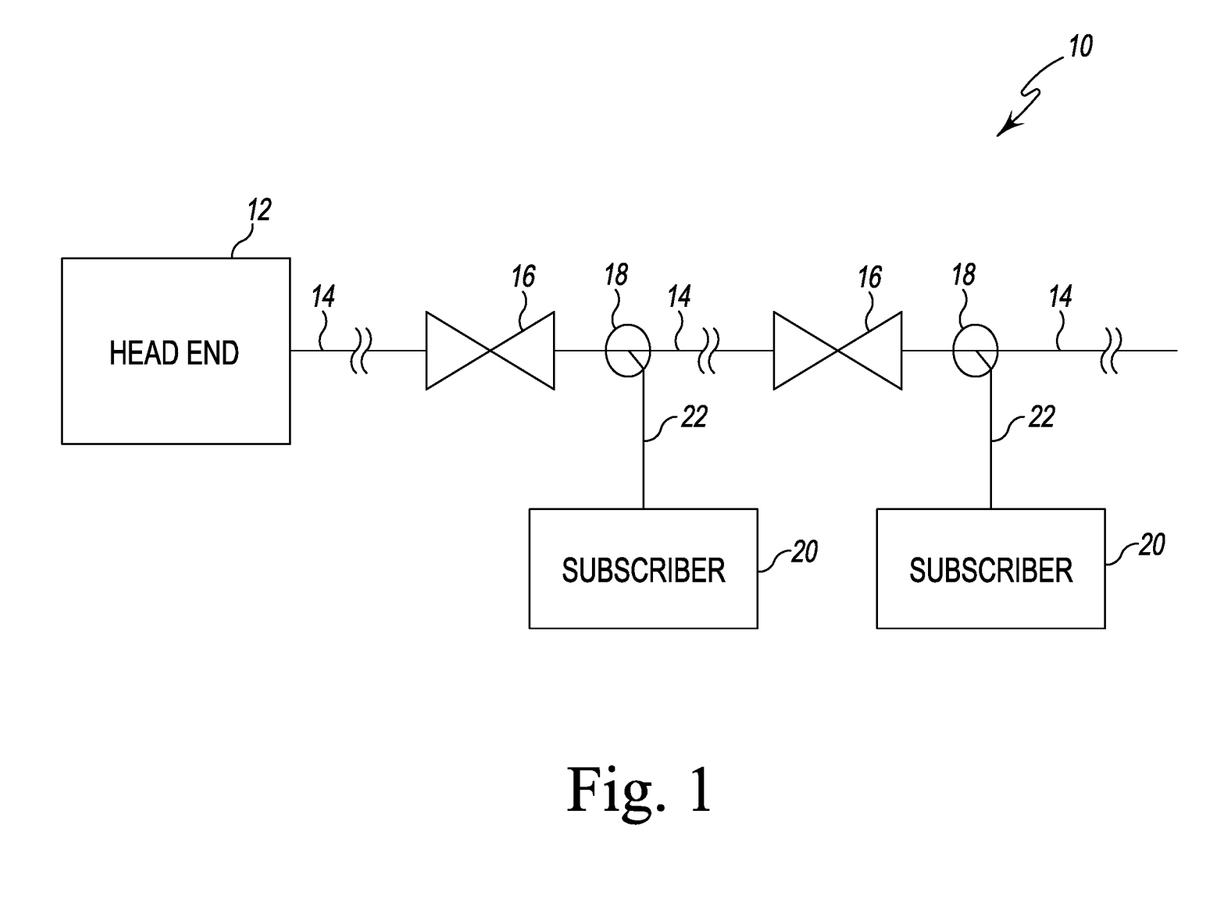
FIG. 1 is a diagram of a CATV system.

Referring now to FIG. 1, a CATV system 10 includes a head end 12 where programming material is obtained and modulated onto appropriate carriers for distribution to subscribers' premises 20. Subscribers' premises may include offices, homes, apartments, or other spaces at which CATV content is desired. The carriers may be combined for distribution downstream to subscribers over what is typically referred to as the forward path. Signals going upstream from subscribers' premises are typically routed in what is called the return path.

The CATV system 10 includes data lines 14 such as, for example, coaxial cable and/or optical fiber that transport the CATV signals. In some embodiments, the CATV signals are transported as radio frequencies (RF). The signals may also be transported in hybrid systems including optical transmission portions in which the RF signals are converted to light for fiber optic transmission over some portions of the signal path and as RF signals over other portions of the signal path.

A number of amplifiers 16 are positioned throughout the CATV system 10 to compensate for signal loss caused by, for example, imperfections in the data lines or splitting of the signal during distribution. The CATV system 10 also includes a plurality of distribution taps 18 that provide points at which the subscribers' premises 20 may be connected. In the illustrative embodiment, a single distribution tap 18 is connected to a single subscriber's premises 20 via a coaxial cable 22. It should be appreciated that in other embodiments one or more of the taps may split the signals for distribution into two, four, or eight subscribers' premises 20.

Figure 2:
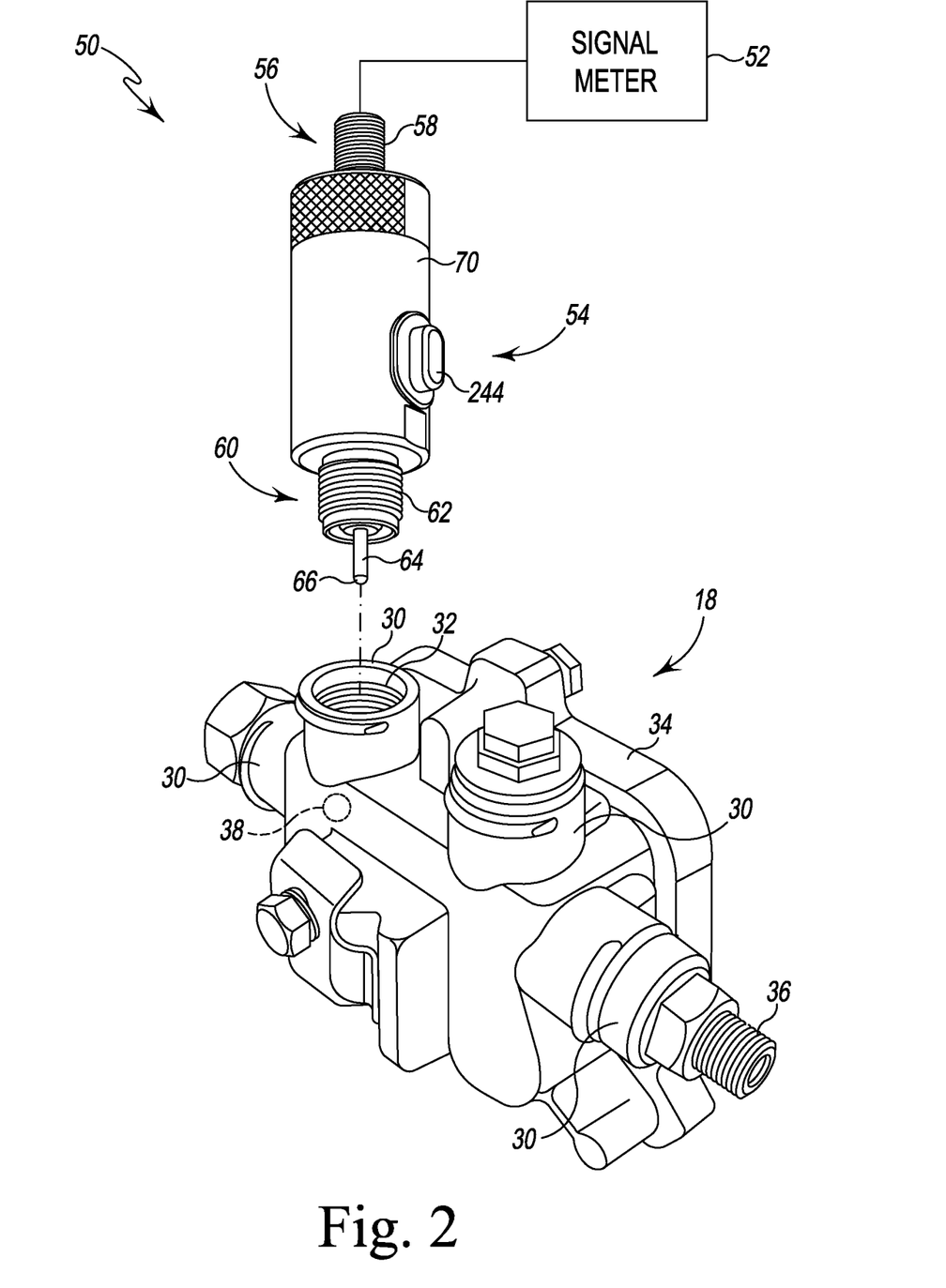
FIG. 2 is an exploded view of an instrument system and a distribution tap of the CATV system of FIG. 1.

Referring now to FIG. 2, the distribution tap 18 includes a number of ports 30 that provide connection points for the data lines 14 of the CATV system 10 and the coaxial cable 22 at the subscriber's premises 20. Each port 30 includes a threaded opening 32 that is defined in the housing 34 of the distribution tap 18. Each opening 32 is sized to receive, for example, a F-connector 36 of a coaxial cable coupler or other device. A test point 38, such as, for example, a seizure screw, is located at the base of each opening 32 to receive and transmit signals over the CATV system 10. As described in greater detail below, a technician may connect an instrument system 50 to one of the ports 30 to evaluate the operation of the CATV system 10, including, for example, the amount of ingress noise present at the distribution tap 18.

In the illustrative embodiment, the instrument system 50 includes a signal level meter 52 and a probe instrument 54 configured to be coupled to the meter 52 and one of the unused ports 30 of the distribution tap 18. The signal level meter 52 may be, for example, a Trilithic 860 DSPi™ signal level meter, which is commercially available from Trilithic, Inc, that is configured to receive signals from the probe 54 and display those signals for analysis by the technician. The probe 54 includes an output port 56 configured to be coupled to the signal level meter 52. In the illustrative embodiment, the port 56 includes a threaded F-connector 58 to engage, for example, a coaxial cable connector extending from the signal level meter 52.

The probe 54 also includes an input port 60 configured to be coupled to a distribution tap 18. In the illustrative embodiment, the input port 60 includes a threaded connector 62 to engage the threaded opening 32 of the distribution tap 18. As shown in FIG. 2, the probe 54 includes a input shaft 64 that extends outwardly from the connector 62 to a shaft tip 66. As described in greater detail below, the input shaft 64 is configured to engage a test point 38 in the distribution tap 18 to selectively connect the electrical circuitry of the probe 54 (and hence the signal level meter 52) to the CATV system 10. The input shaft 64 is compressible to accommodate port openings of varying depth to avoid damage to the electrical circuitry of the probe 54.

Figure 3:
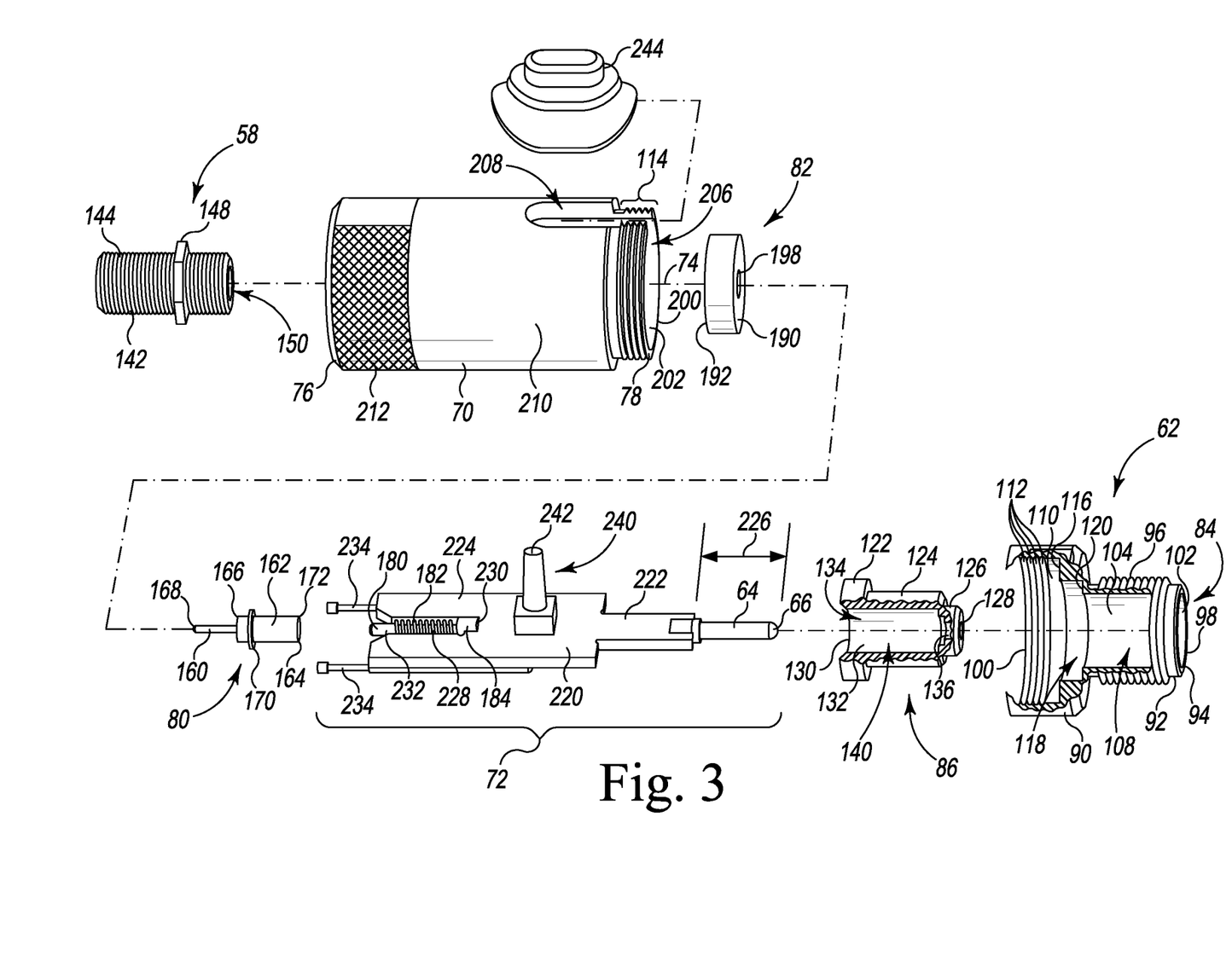
FIG. 3 is an exploded perspective view of a probe instrument of the instrument system of FIG. 2.

Referring now to FIG. 3, the probe 54 is an assembly that includes a housing 70 and an electrical circuit assembly 72 that is positioned in the housing 70. The housing 70 extends along a longitudinal axis 74 of the probe 54 from a proximal end 76 to a distal end 78. The output port 56 is coupled to the proximal end 76 of the housing 70, and the probe 54 includes a connector sleeve 80 that couples the output port 56 to the electrical circuit assembly 72. The connector sleeve 80 is illustratively secured within the housing 70 via a bracket 82. The input port 60 is coupled to the distal end 78 of the housing 70 and includes a passageway 84 that receives a sleeve 86. In the illustrative embodiment, the sleeve 86 is configured to electrically insulate the input shaft 64 of electrical circuit assembly 72 from the input port 60 (and hence the connector 62).

The connector 62 of the input port 60 includes a base 90 and a cylindrical body 92 that extends outwardly from the base 90 to a distal end 94. In the illustrative embodiment, the connector 62 is formed as a single monolithic component from a metallic material such as, for example, stainless steel. It should be appreciated that in other embodiments the connector 62 may be formed from a non-conductive plastic or other polymeric material. The body 92 includes an externally-threaded outer surface 96 that is configured to engage the internally-threaded opening 32 of one of the ports 30 of the distribution tap 18. The connector 62 also includes an opening 98 that is defined in the distal end 94 and another opening 100 that is defined in the opposite end of the base 90. An inner wall 102 extends between the openings 98, 100 to define the passageway 84.

As shown in FIG. 3, the inner wall 102 of the connector 62 includes a distal section 104 that extends inwardly from the opening 98 of the body 92. The distal section 104 includes a curved inner surface that defines a cylindrical portion 108 of the passageway 84. The inner wall 102 has a proximal section 110 that extends inwardly from the opening 100 in the base 90. In the illustrative embodiment, the proximal section 110 includes a plurality of internal threads 112 that are configured to engage a plurality of external threads 114 defined on the distal end 78 of the housing 70 to couple the connector 62 to the housing 70. It should be appreciated that in other embodiments the connector may be coupled to the housing via welding, adhesive, or other fastening means.

Figure 4:
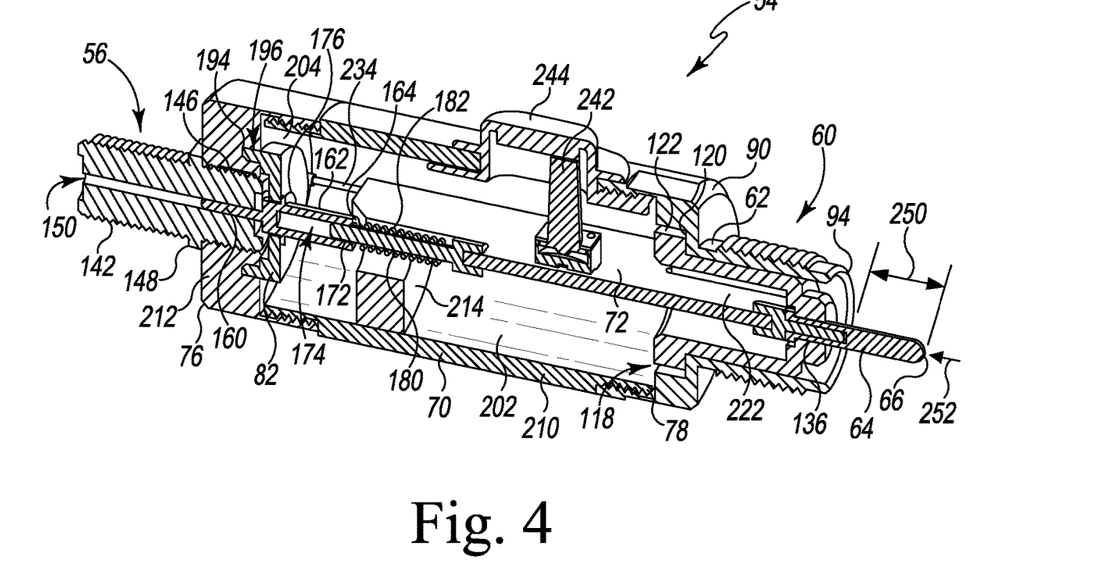
FIG. 4 is a cross-sectional view of the probe instrument taken along the line 4-4 in FIG. 2 showing the electrical circuit assembly in an unloaded position.

The inner wall 102 of the connector 62 includes an annular section 116 that connects the proximal section 110 to the distal section 104. As shown in FIGS. 3-4, a central aperture 118 is defined in the annular section 116, and the cylindrical portion 108 of the passageway 84 opens into the aperture 118. The annular section 116 of the wall 102 also includes a base surface 120 that surrounds the opening of the cylindrical portion 108. As shown in FIG. 4, the base surface 120 is configured to engage a flange 122 of the sleeve 86 when the probe 54 is assembled.

Returning to FIG. 3, the sleeve 86 includes the flange 122, which extends outwardly from a main body 124. The main body 124 is sized to be positioned in the cylindrical portion 108 of the passageway 84 of the connector 62. The sleeve 86 also includes a distal tip 126, which has a smaller diameter and extends from the main body 124. In the illustrative embodiment, the sleeve 86 is formed as a single monolithic component from a non-conductive plastic, such as, for example, Teflon, capable of dielectrically insulating the connector 62 from the electrical circuit assembly 72.

An opening 128 is defined in the distal tip 126 of the sleeve 86 and another opening 130 is defined in the proximal end of the main body 124. An inner wall 132 extends between the openings 128, 130 to define a cavity 134 in the sleeve 86. The cavity 134 includes a distal bore 136 that extends through the distal tip 126 and opens into an aperture 138. The distal bore 136 is sized to receive the input shaft 64 of the electrical circuit assembly 72. The cavity 134 also includes a proximal bore 140 that is sized to receive a portion of the circuit board of the electrical circuit assembly 72, as described in greater detail below.

As described above, the output port 56 is coupled to the proximal end 76 of the housing 70 and includes a threaded F-connector 58. In the illustrative embodiment, the connector 58 is formed as a single monolithic component from a metallic material such as, for example, brass with gold plating. As shown in FIG. 3, the connector 58 includes a body 142 that has a threaded outer surface 144 configured to engage a threaded opening of a signal level meter 52 and a threaded opening 146 of the housing 70. A lock nut 148 secures the body 142 to the housing 70, and a central passageway 150 extends through ends of the body 142.

The central passageway 150 is sized to receive an elongated rod 160 of the connector sleeve 80. As described above, the connector sleeve 80 couples the output port 56 to the electrical circuit assembly 72. In the illustrative embodiment, the connector sleeve 80 includes a shaft 162 that extends from a distal end 164 to a proximal end 166. The elongated rod 160 extends away from the proximal end 166 of the shaft 162 to a proximal tip 168. The connector sleeve 80 also includes a flange 170 that extends outwardly from the main shaft 162 between the ends 164, 166. The connector sleeve 80 is illustratively formed as a single monolithic component from a metallic material such as, for example, brass with gold plating.

As shown in FIG. 4, the connector sleeve 80 includes an opening 172 in the distal end 164. A bore 174 extends inwardly from the opening 172 to a bottom wall 176. The bore 174 is sized to receive an output shaft 180 of the electrical circuit assembly 72, as described in greater detail below, to connect the connector sleeve 80 (and hence the output connector 58) to the electrical circuit assembly 72. The output shaft 180 of the electrical circuit assembly 72 is arranged telescopically with the shaft 162 of the connector sleeve 80. A mechanical biasing element such as, for example, spring 182 is positioned between the distal end 164 of the connector sleeve 80 and a base 184 of the shaft 162.

The spring 182 extends over the length of the shaft 162, as shown in FIG. 3. In other embodiments, the mechanical biasing element be take the form of an elastomeric body or other structure configured operable to bias the circuit board 220 in the unloaded position shown in FIG. 4.

As described above, the probe 54 includes a bracket 82 that secures the connector sleeve 80 within the housing 70. The bracket 82 has a distal surface 190 and a proximal surface 192 positioned opposite the distal surface 190. As shown in FIG. 4, the bracket 82 has a rim wall 194 that extends inwardly from an opening defined in the proximal surface 192. The rim wall 194 is sized to be positioned over in a groove 196 of the housing 70 of the probe 54. A central opening 198 sized to receive the shaft 162 of the connector sleeve 80 extends through the bracket 82. In the illustrative embodiment, the bracket 82 is formed as a single monolithic component from a non-conductive plastic such as, for example, Teflon, capable of dielectrically insulating the connector sleeve 80 from the housing 70.

As shown in FIGS. 3-4, the housing 70 of the extends along the longitudinal axis 74 from the proximal end 76 to the distal end 78. As described above, the housing 70 has a plurality of external threads 114 that are defined on the distal end 78, which are configured to engage the threads 112 of the connector 62. The distal end 78 also has an opening 200, and an inner wall 202 extends inwardly from the opening 200 to a bottom wall 204. The walls 202, 204 cooperate to define an inner chamber 206 sized to receive the electrical circuit assembly 72. The housing 70 also includes an oblong slot 208 that opens into one side of the chamber 206.

As described above, the housing 70 includes a groove 196 that receives the bracket 82. The groove 196 is defined in the bottom wall 204, as shown in FIG. 4. The threaded opening 146, which receives the output connector 58, is surrounded by the groove 196.

In the illustrative embodiment, the housing 70 includes a barrel 210 and a cap 212 defines the proximal end 76. As shown in FIG. 4, the cap 212 is threaded onto one end of the barrel 210, and includes the bottom wall 204 of the housing 70. The barrel 210 and the cap 212 are each formed from a metallic material, such as, for example, aluminum. It should be appreciated that in other embodiments the housing 70 may be formed as a single monolithic component from a metallic material, such as, for example, aluminum or stainless steel. Additionally, the housing 70, the input connector 62, and output connector 58 cooperate to define the main body of the probe 54. In other embodiments, the main body may be formed by combining the housing and one or more of the connectors into a single monolithic component.

As shown in FIG. 4, the probe 54 also includes a support bracket 214 that is coupled to the inner wall 202 of the housing 70. The bracket 214 includes a pair of planar surfaces that engage the electrical circuit assembly 72 in the inner chamber 206 and prevent the electrical circuit assembly 72 from rotating about the axis 74. In the illustrative embodiment, the support bracket 214 is formed as a single monolithic component from a non-conductive plastic such as, for example, Teflon, capable of dielectrically insulating the electrical circuit assembly 72 from the housing 70.

Returning to FIG. 3, the electrical circuit assembly 72 includes a printed circuit board (PCB) 220 that has a distal section 222 and a proximal section 224. The electrical circuit assembly 72 also includes the input shaft 64 extending outwardly from the distal section 222. The input shaft 64 extends a fixed length 226 from the distal board section 222 to the shaft tip 66. In the illustrative embodiment, the length 226 is equal to about 0.550 inches.

As shown in FIG. 4, the distal board section 222 is narrower than the proximal board section 224 and is sized to extend into the proximal bore 140 of the insulator sleeve 86 to minimize the length 226 of the input shaft 64. The proximal section 224 is wider than the diameter of the proximal bore 140 and is thereby prevented from entering the bore 140.

The proximal board section 224 includes a longitudinal slot 228 that extends inwardly along the axis 74 from its proximal edge. As shown in FIG. 3, the output shaft 180 is positioned in the longitudinal slot 228. The output shaft 180 has a base 184 that is connected to an inner edge 230 of the proximal board section 224 and an elongated body 232 that extends outwardly from the base 184.

The electrical circuit assembly 72 also includes a pair of telescopic legs 234 that extend proximally from the board section 224. Each leg 234 has an end 236 configured to engage the bottom wall 204 of the housing 70. The components of each leg 234 are illustratively formed from a metallic material such as, for example, brass with gold plating. Each leg 234 is also spring-loaded in the illustrative embodiment to assist in biasing the circuit board 220 in the unloaded position shown in FIG. 4.

As described in greater detail below, the electrical circuit assembly 72 is operated via a user-control 240 that extends outwardly from the PCB 220. In the illustrative embodiment, the user-control 240 includes a switch having a lever arm 242 that extends outwardly from the oblong slot 208 defined in the housing 70. The probe 54 includes a cover 244 that is positioned in the slot 208 over the end of the lever arm 242 to prevent moisture or other environmental contaminants from entering the inner chamber 206.

As described above, the input shaft 64 of the probe 54 is compressible to accommodate port openings of varying depth to avoid damage to the electrical circuitry of the probe 54. As shown in FIG. 4, the electrical circuit assembly 72 is initially in an unloaded position, and a distance 250 is defined between the shaft tip 66 and the distal end 94 of the connector 62 along the axis 74. When the probe 54 is coupled to a port 30 of a distribution tap 18, the technician engages the input connector 62 with the opening 32 and, by threading the connector 62 into the opening, advances the probe 54 deeper into the port 30.

As the probe 54 moves deeper into the port 30, the distal shaft tip 66 of the input shaft 64 is advanced into contact with the test point 38 (e.g., a seizure screw) and the electrical circuit assembly 72 is coupled to the CATV system 10. The technician may continue to thread the connector 62 into the port 30 to bottom the shoulder of the connector base 90 against the distribution tap 18. When the technician continues to thread the connector 62 into the port 30 after the shaft tip 66 contacts the test point 38, a load is exerted in the direction indicated by arrow 252 in FIG. 4 on the shaft 64 (and hence the electrical circuit assembly 72). This load overcomes the bias exerted by the spring 182, and the electrical circuit assembly 72 (including the PCB 220) may move proximally to the loaded position shown in FIG. 5.

Figure 5:
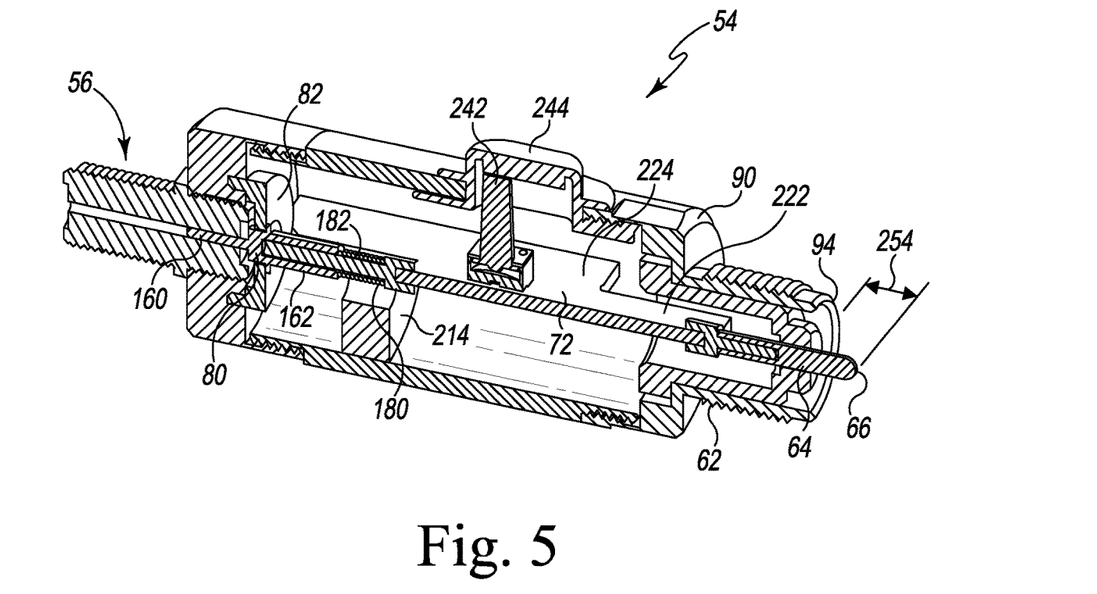
FIG. 5 is a view similar to FIG. 4 showing the electrical circuit assembly in loaded position.

In the loaded position, a distance 254 is defined between the shaft tip 66 and the distal end 94 of the connector 62 along the axis 74. The distance 254 is less than the distance 250. In the illustrative embodiment, the distance between the shaft tip 66 and the shoulder of the connector base 90 between the unloaded and the loaded position decreases by the same amount.

When the input shaft 64 of the probe 54 contacts the test point 38 (e.g., a seizure screw) and the electrical circuit assembly 72 is coupled to the CATV system 10, the user may operate the user-control 240 (e.g., switch) to connect a filter circuit 302 of the electrical circuit assembly 72. If connecting the filter circuit 302 causes the measured ingress to decrease by, for example 4 to 6 dB, then the source of the ingress is further downstream in the CATV system 10. If connecting the filter circuit 302 does not cause the measured ingress to decrease, then the source of the ingress is upstream in the CATV system 10. By proceeding along the data lines 14, the technician may locate and isolate the ingress noise source.

As shown in FIG. 5, the electrical circuit assembly 72 includes a coupling circuit 300 on the PCB 220 that is connected to the input shaft 64 and the output shaft 180. The coupling circuit 300 is configured to attenuate the signals received from the CATV system 10 before supplying those signals to the meter 52 coupled to the output port 56. In the illustrative embodiment, the coupling circuit 300 is configured to provide attenuation that reduces the amplitude of the signals received at the input port 60 by about 20 dB before supplying those signals to the output port 56. The frequencies of the signals attenuated by the circuit 300 are in a range of about 5 MHz to about 1.2 GHz. As used herein, the term "about" refers to fifteen percent tolerance based on manufacturing variation and other design criteria. As such, the phrase "about 5 MHz," for example, encompasses 4.25 MHz, while the phrase "about 1.2 GHz" includes 1380 MHz.

As described above, the electrical circuit assembly 72 also includes a filter circuit 302, which is selectively coupled to the input shaft 64 (and hence the input port 60 and the CATV system 10) by the switch 240. In the illustrative embodiment, the filter circuit 302 is configured to attenuate signals in a frequency range of about 5 MHz to about 30 MHz This frequency range corresponds to the return path frequencies at which noise ingress signals might be present in the CATV system 10 (i.e., the noise frequencies of the CATV system). In other words, when the filter circuit 302 is coupled to the input shaft 64 (i.e., when the switch 240 is toggled), signals in the frequency range of 5 MHz to 30 MHz are suppressed in the CATV system 10. If the CATV headend 12 registers a decrease in ingress of 4 to 6 dB, the noise source is farther from the head end 12 that the test location. The technician may monitor the change in ingress using the signal level meter 52, which receives telemetry from the headend 12 via the probe instrument 54. In other embodiments, the frequency range of the filter circuit 302 may be in a range of about 5 MHz to 42 MHz. It should be appreciated that in other embodiments the filter may be designed to permit signals in the noise ingress frequency range to pass to the signal level meter 52 and suppress or attenuate signals at other frequency ranges.

In the illustrative embodiment, the electrical circuit assembly 72 also includes AC and DC blocking circuits 304, 306. The blocking circuit 304, which is included in the coupling circuit 300, is configured to prevent excessive power from being transmitted from the CATV system 10 to the signal level meter 52. It should be appreciated that in other embodiments the blocking circuit 304 may be omitted. The blocking circuit 306 is configured to prevent excessive power from being transmitted from the CATV system 10 to the filter circuit 302.

The electrical circuit assembly 72 also includes a high frequency block circuit 308 so that the filter circuit 302 does not affect signals present on the CATV when the probe 54 is connected to the tap 18. In that way, the filter circuit 302 only affects signals present on the CATV in the frequency range of 5 to 30 MHz when the button 242 is depressed and the filter circuit 302 is coupled to the block circuit 308 (which is coupled to the CATV system via the tip of pin 66).

Figure 6:
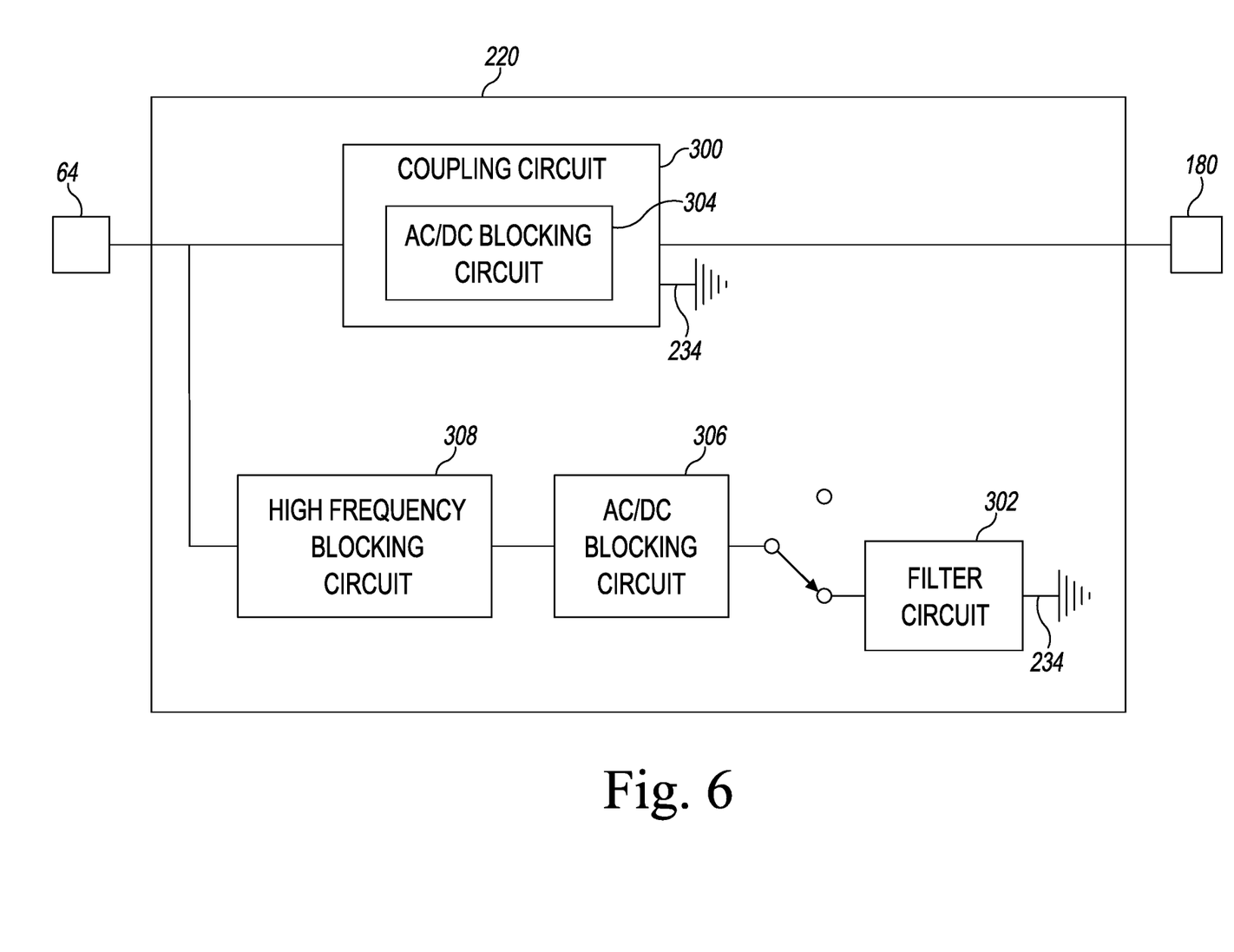
FIG. 6 is a block diagram of the electrical circuit assembly of the probe instrument of FIG. 2-5.

As shown in FIG. 6, the telescopic legs 234 ground the circuitry by connecting the circuit board 220 to the bottom wall 204 of the housing 70. It should be appreciated that in other embodiments a wire, pin, or other structure may be used to ground the board 220.

Figure 7:
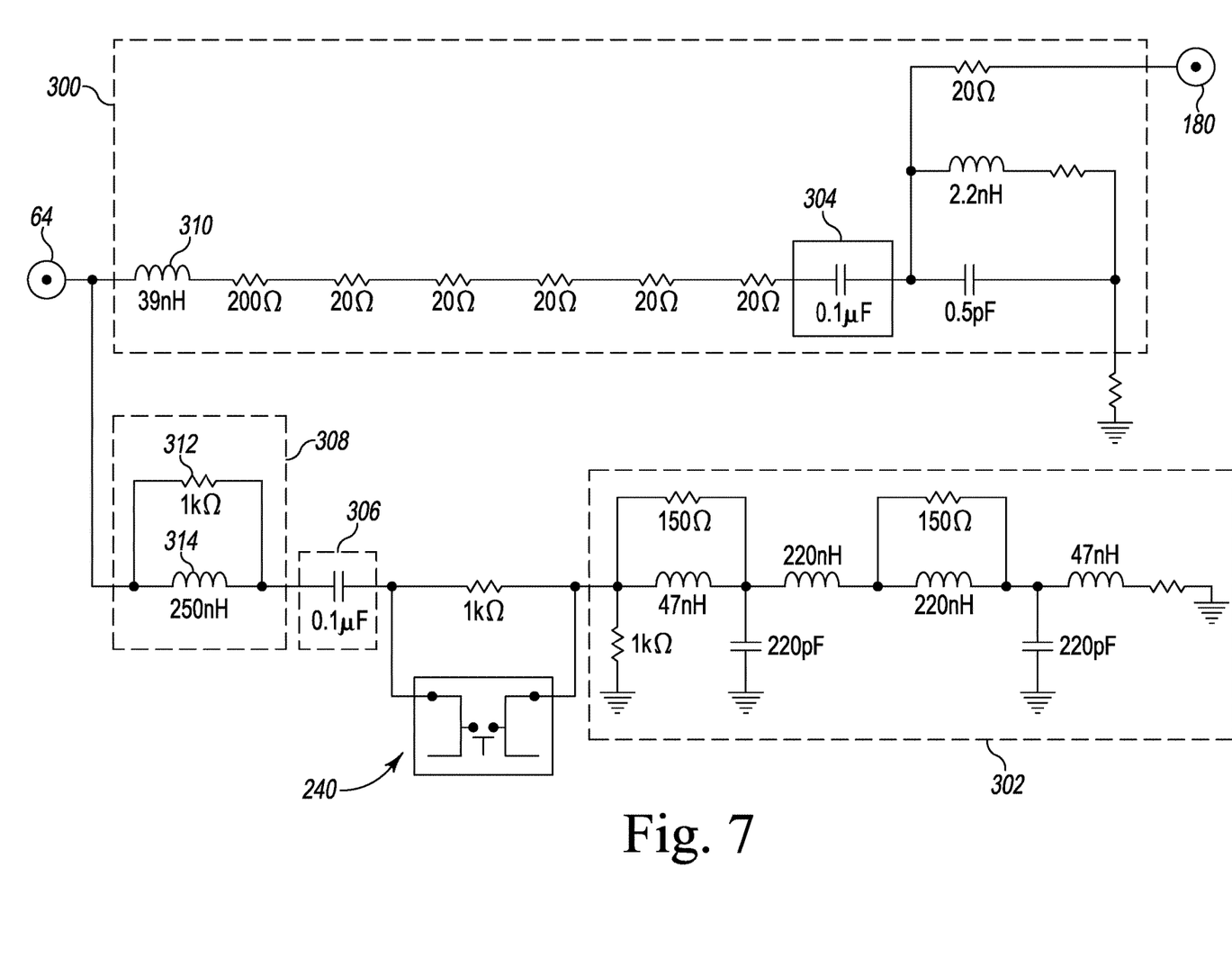
FIG. 7 is an exemplary electrical schematic of the electrical circuit assembly of FIG. 6.

An exemplary schematic of the circuits 300, 302, 304, 306, 308 is shown in FIG. 7. In the illustrative embodiment, the circuit 300 is configured to provide an insertion loss at about 1.2 GHz of about 1.5 dB between the input port 60 and the output port 56. It should be appreciated that other arrangements of the circuits 300, 302, 304, 306 may be used to adjust the amount of attenuation and the bandwidth of the filter circuit. Additionally, in other embodiments, the circuit 300 may be omitted.

As shown in FIG. 7, the circuit 300 includes a 39 nH inductor 310 that is coupled to the input shaft 64. The circuit 308 includes a 1 kΩ resistor 312 in parallel with a 250 nH inductor 314, which are also coupled to the input shaft 64. In the illustrative embodiment, the inductors 310, 314 and the resister 312 are positioned on the distal board section 222 to position those elements close to the input shaft 64 and thereby permit the circuitry to operate effectively up to about 1.2 GHz.

As described above, this application discloses, among other things, a method of locating noise in a CATV system that comprises aligning a first connector of an instrument with a port of a CATV tap, engaging the first connector of the instrument with the port to position a shaft tip in an aperture defined in the port, advancing the shaft tip into contact with a test point positioned in the aperture to cause a circuit board of the instrument to move, operating a user-operated control to connect a filter on the circuit board to a signal level meter to suppress noise frequencies in the CATV system upstream from the port, and determining a noise source based on signals provided through the instrument.

This application also discloses, among other things, an electrical circuit assembly for an instrument for locating noise in a CATV system that comprises a printed circuit board including a first board section sized to be positioned in a connector and a second board section, a filter mounted on the printed circuit board that is configured to suppress noise frequencies in the CATV system, a first shaft coupled to the first board section and extending outwardly from the first board section in a first direction to a shaft tip, a second shaft extending from the second board section in a second direction opposite the first direction, a spring positioned over the second shaft, and a user-operated control extending outwardly from the printed circuit board. The user-operated control is operable to electrically connect the filter to the first shaft. The electrical circuit assembly may further comprise a pair of telescopic legs coupled to the printed circuit board. A slot may be defined in the printed circuit board, and the first shaft may be positioned in the slot.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A method of locating noise in a CATV system, the method comprising:
   aligning a first connector of an instrument with a port of a first CATV tap of the CATV system;
   engaging the first connector with the port such that an input shaft of the instrument is received in an aperture defined in the port;
   advancing the input shaft into contact with a test point positioned in the aperture to move a circuit board within the instrument;
   observing one or more noise frequencies in the CATV system with a signal level meter coupled to a second connector of the instrument; and
   operating a control of the instrument to couple a filter on the circuit board to the input shaft to suppress each of the one or more noise frequencies that has a point of ingress into the CATV system that is upstream of the first CATV tap.

2. The method of claim 1, wherein advancing the input shaft into contact with the test point to move the circuit board within the instrument comprises overcoming a bias force exerted by a spring coupled to the circuit board to move the circuit board from an unloaded to a loaded position.

3. The method of claim 2, wherein operating the control to couple the filter to the input shaft comprises moving a switch from a first position to a second position when the circuit board is in the loaded position.

4. The method of claim 1, further comprising observing, with the signal level meter, whether an amplitude of a noise frequency of interest decreases after the filter is coupled to the input shaft.

5. The method of claim 4, further comprising, in response to observing that the amplitude of the noise frequency of interest decreases after the filter is coupled to the input shaft:
   disengaging the first connector of the instrument from the port of the first CATV tap; and
   engaging the first connector of the instrument with a port of a second CATV tap located upstream of the first CATV tap when the first connector of the instrument is engaged with the port of the second CATV tap.

6. The method of claim 5, further comprising:
   observing the one or more noise frequencies in the CATV system with the signal level meter coupled to the second connector of the instrument; and
   operating the control of the instrument to couple the filter on the circuit board to the input shaft to suppress each of the one or more noise frequencies that has a point of ingress into the CATV system that is upstream of the second CATV tap.

7. The method of claim 4, further comprising, in response to observing that the amplitude of the noise frequency of interest does not decrease after the filter is coupled to the input shaft:
   disengaging the first connector of the instrument from the port of the first CATV tap; and
   engaging the first connector of the instrument with a port of a second CATV tap located downstream of the first CATV tap.

8. The method of claim 7, further comprising:
   observing the one or more noise frequencies in the CATV system with the signal level meter coupled to the second connector of the instrument when the first connector of the instrument is engaged with the port of the second CATV tap; and
   operating the control of the instrument to couple the filter on the circuit board to the input shaft to suppress each of the one or more noise frequencies that has a point of ingress into the CATV system that is upstream of the second CATV tap.

9. The method of claim 4, further comprising:
   disengaging the first connector of the instrument from the port of the first CATV tap; and
   engaging the first connector of the instrument with a port of a second CATV tap, wherein the second CATV tap is located: (i) upstream of the first CATV tap when the amplitude of the noise frequency of interest decreased after the filter was coupled to the input shaft or (ii) downstream of the first CATV tap when the amplitude of the noise frequency of interest did not decrease after the filter was coupled to the input shaft.

10. A method comprising repeating the steps of claim 4 at each of a plurality of CATV taps of the CATV system to locate: (i) the CATV tap that is immediately upstream of the point of ingress of the noise frequency of interest and (ii) the CATV tap that is immediately downstream of the point of ingress of the noise frequency of interest.

11. A method of locating noise in a CATV system, the method comprising:
    aligning a first connector of an instrument with a port of a first CATV tap of the CATV system;
    engaging the first connector with the port such that an input shaft of the instrument is received in an aperture defined in the port;
    advancing the input shaft into contact with a test point positioned in the aperture to move a circuit board within the instrument;
    observing one or more noise frequencies in the CATV system with a signal level meter coupled to a second connector of the instrument; and
    operating a control of the instrument to couple a filter on the circuit board to the input shaft to suppress each of the one or more noise frequencies that has a point of ingress into the CATV system that is downstream of the first CATV tap.

12. The method of claim 11, wherein advancing the input shaft into contact with the test point to move the circuit board within the instrument comprises overcoming a bias force exerted by a spring coupled to the circuit board to move the circuit board from an unloaded to a loaded position.

13. The method of claim 12, wherein operating the control to couple the filter to the input shaft comprises moving a switch from a first position to a second position when the circuit board is in the loaded position.

14. The method of claim 11, further comprising observing, with the signal level meter, whether an amplitude of a noise frequency of interest decreases after the filter is coupled to the input shaft.

15. The method of claim 14, further comprising, in response to observing that the amplitude of the noise frequency of interest decreases after the filter is coupled to the input shaft:

disengaging the first connector of the instrument from the port of the first CATV tap; and engaging the first connector of the instrument with a port of a second CATV tap located downstream of the first CATV tap.

16. The method of claim 15, further comprising:

observing the one or more noise frequencies in the CATV system with the signal level meter coupled to the second connector of the instrument when the first connector of the instrument is engaged with the port of the second CATV tap; and operating the control of the instrument to couple the filter on the circuit board to the input shaft to suppress each of the one or more noise frequencies that has a point of ingress into the CATV system that is downstream of the second CATV tap.

17. The method of claim 14, further comprising, in response to observing that the amplitude of the noise frequency of interest does not decrease after the filter is coupled to the input shaft:

disengaging the first connector of the instrument from the port of the first CATV tap; and engaging the first connector of the instrument with a port of a second CATV tap located upstream of the first CATV tap.

18. The method of claim 17, further comprising:

observing the one or more noise frequencies in the CATV system with the signal level meter coupled to the second connector of the instrument when the first connector of the instrument is engaged with the port of the second CATV tap; and operating the control of the instrument to couple the filter on the circuit board to the input shaft to suppress each of the one or more noise frequencies that has a point of ingress into the CATV system that is downstream of the second CATV tap.

19. The method of claim 14, further comprising:

disengaging the first connector of the instrument from the port of the first CATV tap; and engaging the first connector of the instrument with a port of a second CATV tap, wherein the second CATV tap is located: (i) downstream of the first CATV tap when the amplitude of the noise frequency of interest decreased after the filter was coupled to the input shaft or (ii) upstream of the first CATV tap when the amplitude of the noise frequency of interest did not decrease after the filter was coupled to the input shaft.

20. A method comprising repeating the steps of claim 14 at each of a plurality of CATV taps of the CATV system to locate: (i) the CATV tap that is immediately upstream of the point of ingress of the noise frequency of interest and (ii) the CATV tap that is immediately downstream of the point of ingress of the noise frequency of interest.

* * * * *